Oct. 3, 1967 D. G. PEDROTTI 3,345,236

APPARATUS FOR BONDING INTEGRATED CIRCUIT PACKAGES

Filed Feb. 24, 1964

*INVENTOR.*
DONALD G. PEDROTTI

United States Patent Office 3,345,236
Patented Oct. 3, 1967

3,345,236
APPARATUS FOR BONDING INTEGRATED CIRCUIT PACKAGES

Donald G. Pedrotti, Cupertino, Calif., assignor to RCK, Inc., Sunnyvale, Calif., a corporation of California
Filed Feb. 24, 1964, Ser. No. 346,607
6 Claims. (Cl. 156—498)

ABSTRACT OF THE DISCLOSURE

An automatic package-sealing apparatus having a support for holding the packages, a heating element maintained at a constant temperature and a sequential mechanism for disposing package supports, one after the next, in contact with the heating element in order to sequentially seal rows of such packages.

Figure 1:
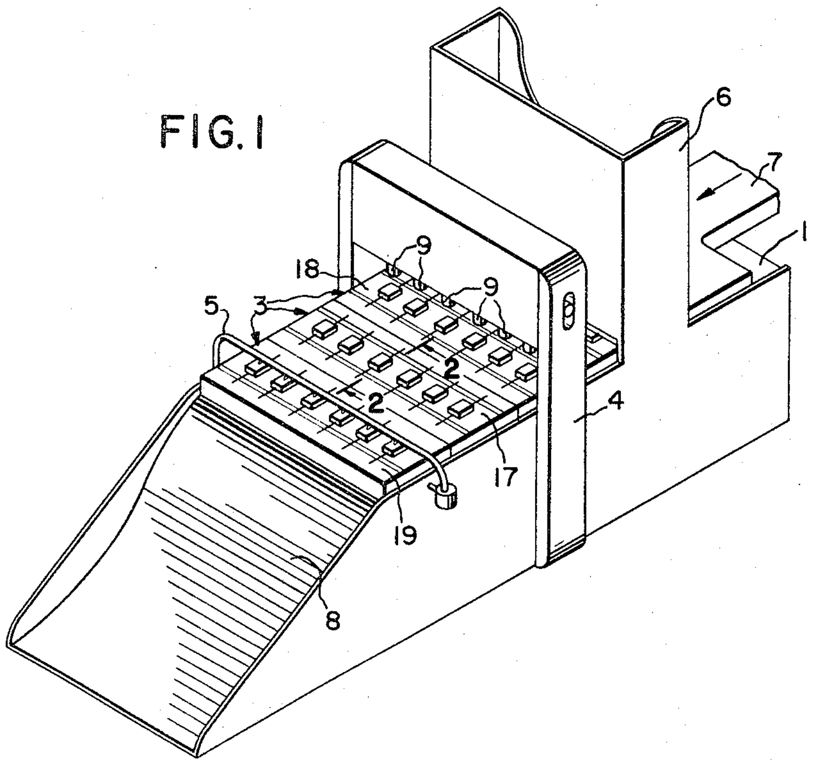

This invention relates to apparatus for sequentially sealing a series of packages, such as those containing integrated semiconductor circuits. These packages have at least two parts to be sealed together with a heat-curable cement. Each package contains a semiconductor element, which may be a single transistor, but normally is a plurality of transistors and other circuit elements combined in a single body of semiconductor material (normally called semiconductor integrated circuits). The packages generally have a base member and a cover. The base member contains the semiconductor element with the leads from the device extending from its periphery. The cover is placed over the base member and the device it contains. The cover is then sealed on the base member, with the leads to be used for making electrical connection to the enclosed circuit extending from the periphery of the package.

In the past, the principal difficulty with sealing these packages is the possible damage to the semiconductor element which may occur during sealing. With prior art sealing methods, mass production has not been found possible because previously available mass production bonding methods resulted in damage to the semiconductor wafer. The heat applied to the package to bond the heat-curable cement is passed by conduction through the package and into the semiconductor element. This heat will often damage the bonds previously made between the delicate electrical leads and the electrodes of the semiconductor element inside. Thus, the yield of acceptable devices after packaging was appreciably reduced.

This invention provides apparatus for automatically sequentially sealing a series of circuit packages in such a fashion that no concomitant damage occurs to the enclosed delicate semiconductor element and attached lead structure. Heat may be applied to a plurality of these devices in one step according to this invention, thereby sealing the covers on each package, and yet no damage occurs to the enclosed semiconductor element and attached leads. By the apparatus of this invention, groups of packages may be sequentially bonded, one after the next, in an automatic fashion, providing a very high yield of non-defective devices. In the past, a loss of fifty percent of the devices in packaging was not uncommon.

Briefly, the apparatus of this invention comprises:

(a) A support adapted to hold at least one of the packages having at least two parts with a heat-curable cement therebetween in intimate engagement therewith, thereby providing a heat sink for said package;

(b) A heating element adapted to be maintained at a constant temperature while in use, and (c) A means for sequentially disposing one of said supports after the next in position to place a surface of a package engaged therewith in contact with the heating element, thereby enabling heat to be applied to said package to cure said cement while dissipating the excess heat in the support, thus preventing such excess heat from damaging the semiconductor element.

Figure 2:
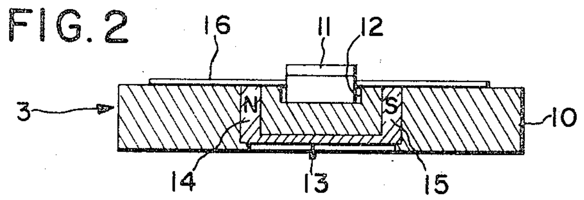

The apparatus of this invention, and the details of its construction and operation, will be more fully understood from the following more specific description, making reference to the drawings in which:

FIG. 1 is a pictorial view of the apparatus of a preferred embodiment of the invention; and FIG. 2 is a cross-section of a support of this invention taken through the plane 2—2 of FIG. 1.

Referring to FIG. 1, the apparatus of this invention for sequentially sealing the series of packages, each having at least two parts with a heat-curable cement therebetween, and each containing a semiconductor element, includes a channel 1. Channel 1 is adapted to slidably hold a plurality of supports 3. These supports are free to slide in channel 1 beneath elevator bar 4 and cooling means 5. In the preferred embodiment of FIG. 1, supports 3 are loaded in magazine loading means 6. Pusher 7 is used to push each support from the bottom of magazine loading means 6 so that it may pass beneath elevator bar 4 and cooling means 5. As each support in the magazine loading means is pushed from beneath loading means 6, another support drops into the place of the previous one. This next support is pushed out by the next stroke of pusher 7.

It must be understood that magazine loading is not the only method of moving the supports 3 within the apparatus of the invention. Alternatively, a conveyor belt may be used to slide the supports along channel 1. Such a belt will also serve to automatically move supports 3 beneath elevator bar 4 for the application of heat. After passing beneath elevator bar 4 and cooling means 5, supports 3 fall down slide 8 and are thus removed from the apparatus.

Elevator bar 4 is an important part of the invention. It contains a plurality of heating elements 9. These heating elements are preferably fabricated from a ceramic material. Such ceramic materials have a high thermal conductivity which make them very useful as heating elements. Moreover, in contradiction to metal heating elements which tend to scale after constant use, ceramic heating elements are relatively scale-free. Additional advantages of ceramic heating elements are that they are electrical insulators, thereby eliminating the danger of short circuits causing injury to the user. Moreover, ceramic has a low coefficient of expansion and will therefore not crack when the heat is turned off and on between uses of the apparatus. Although mullite (containing at least a major proportion of $Al_2O_3$ and the rest $SiO_2$) or other ceramic materials, may be employed, beryllium oxide (BeO) is the preferred ceramic for use in this invention because of its high thermal conductivity.

Heating elements 9 are adapted to be maintained at a constant temperature while in use. These elements are preferably heated using conventional resistive heating (achieved by winding a coil of wire around a portion of the heating element). Alternatively, inductive heating may beu sed, but has been found less satisfactory. It is essential to the invention that the heating elements 9 be maintained at a relatively constant temperature during use. When attempts have been made to cool the heating element and reheat them between each seal, very unsatisfactory results were obtained. This was partly because it was not possible to maintain constant the amount of heat applied to each successive device when the heating element is cooled in between sealings. With this invention, the heating elements 9 are always kept at a constant temperature. This temperature may be anywhere from about 360° and 1000° C., preferably between about 700° and 1000° C.

Using ceramic, glass, or metal packages, with conventional glass frit as the heat-curable cement, satisfactory results were obtained at these temperatures. It is also possible to use one part of the package of one of the above materials, and the other part to be joined of another material. The description of the ceramics and frit which may be employed is found in U.S. Patent 2,889,952.

The supports 3, adapted to hold at least one, preferably a plurality of the packages in intimate engagement therewith are also important to the invention. Each support provides a heat sink for the packages by virtue of their intimate engagements therewith. A preferred embodiment of a support of this invention is shown in cross-section in FIG. 2. Referring to FIG. 2, the body 10 of the support is formed of a good heat conductor, such as copper or aluminum. Package 11 is adapted to rest in intimate engagement with the body 10 of support 3, as shown. In the preferred embodiment, a cavity 12 is formed in body 10. Package 11 rests within that cavity. In order to hold package 11 in intimate engagement with body 10, a magnet 13 is used having north pole 14 and south pole 15. This magnet securely holds metal leads 16 extending from the sides of package 11 to body 10. Thus, package 11 is feld firmly against body 10 of support 3 to insure that heat passed into package 11 from heating elements 9 (FIG. 1) will be dissipated within body 10. Body 10 thus provides a heat sink in order to prevent the heat applied during sealing from damaging the semiconductor element contained in package 11.

Referring to FIG. 1, to provide the means for disposing the packages in sealing position adjacent heating elements 9, the means for sliding the supports 3 (e.g., pusher 7) combines with a means for sequentially disposing the support so that a surface of each package in the support is in contact with heating elements 9. Thus, a solenoid or other means (not shown) is used to move elevator bar 4 downwardly so that heating elements 9 contact the tops of packages 11. Alternatively, support 3 may be moved upwardly beneath elevator bar 4 to achieve such engagement. The period of engagement may be relatively brief, for example, thirty seconds to one minute, where the heating elements 9 are at the temperatures described above. Obviously, the higher the temperature of element 9, the less the required period of engagement.

After engagement, elevator bar 4 and/or support 3 is returned to its normal position shown in FIG. 1. It has been found that slow disengagement of the elements 9 from the packages has the effect of an annealing cycle which reduces heat stress and results in a better seal. Then the conveyor belt or pusher 7 is actuated to move support 3 from beneath elevator bar 4 to the position of support 17 shown in FIG. 1. While in this position, support 17 is exposed to the atmosphere and allowed to cool under ambient conditions. Depending on the cooling cycle required, one or more spaces may be left between elevator bar 4 and cooling means 5. The greater the number of spaces maintained between elevator bar 4 and cooling means 5, the longer will be the cooling period under ambient conditions. If the heating cycle is one minute, support 17 will be allowed to cool for one minute under ambient conditions while support 18 is being heated. If two support spaces intervene between elevator bar 4 and cooling means 5, a two minute ambient cooling would be provided. After the ambient cooling, and concurrent with the next shift, the support 18 then beneath elevator bar 3 moves to the position shown in FIG. 1 of support 17. Similarly, support 17 moves to the position of support 19 beneath rapid cooling means 5. Although a rapid cooling means is not necessarily required, in the preferred embodiment illustrated, a cooling means 5 consisting of a jet of nitrogen is used. This jet is adapted to rapidly cool the packages to ambient temperature. Although a certain amount of cooling occurred while the support was in the position of support 17, additional rapid cooling is achieved under cooling means 5. Cooling means 5 may be adapted to cool the packages to ambient temperature, or near to ambient temperature, so that the fifinal cooling to ambient temperature will not occur until after the support leaves the position beneath cooling means 5. The details of the cycle are up to the skill of the practitioner, and are determined according to the characteristics of the packages being sealed.

An important feature of the invention is that while heat is being applied to packages through heating elements 9, the excess heat is being dissipated in the conductive body 10 of supports 3. Therefore, the yield of good devices after packaging is appreciably increased by the elimination of heat damage to the semiconductor elements resulting from heat applied during sealing.

The apparatus of the invention may, if desired, be used not only to seal the parts of the package, but also to apply heat to bond the leads extending into the package to the semiconductor wafer (or to electrodes on the semiconductor wafer). Thus, with this invention, two steps in the device manufacture and packaging may be combined into a single operation.

While a preferred embodiment of the invention has been described above in connection with FIGS. 1 and 2, it must be understood that many modifications may be made in the invention by one skilled in the art without departing from its spirit and scope. For example, the particular method used to engage elevator bar 4 with supports 3 so that heating elements 9 contact the cover of packages 11 may be substantially varied. Furthermore, the method of locomotion of the supports 3 through the apparatus may vary while still making use of the important aspects of this invention. In some instances, rapid cooling means 5 is not required. The ambient cooling achieved under atmospheric conditions in those instances is considered sufficient. Therefore, the only limitations to be placed on the scope of this invention are those specifically spelled out in the claims which follow.

What is claimed is:

1. Apparatus for sequentially sealing a series of packages, each having at least two parts with a heat-curable cement therebetween, and each containing a semiconductor element, which apparatus comprises:

(a) a support adapted to hold at least one of said packages in intimate engagement therewith, thereby providing a heat sink for said package;

(b) a heating element adapted to be maintained at a constant temperature while in use; and (c) a means for sequentially disposing one of said supports after the next in position to place a surface of the package engaged therewithin in contact with said heating element, thereby enabling heat to be applied to said package to cure said cement while dissipating the excess heat in said support, thus preventing such excess heat from damaging said semiconductor element.

2. Apparatus for sequentially sealing a series of packages, each having at least two parts with a heat-curable cement therebetween, and each containing a semiconductor element, which apparatus comprises:

(a) a support adapted to hold at least one of said packages in intimate engagement therewith, thereby providing a heat sink for said package;

(b) a heating element adapted to be maintained at a constant temperature while in use; and (c) a means for sequentially disposing one of said supports after the next in position to place a surface of the package engaged therewith in contact with said heating element, thereby enabling heat to be applied to said package to cure said cement while dissipating the excess heat in said support, thus preventing such excess heat from damaging said semiconductor element, said disposing means including a stacking channel in which one of said supports may be stacked atop the next so that each support may be sequentially fed into the desired position from the end of said channel.

3. Apparatus for sequentially sealing a series of packages, each having at least two parts with a heat-curable cement therebetween, and each containing a semiconductor element, which apparatus comprises:

(a) a support adapted to hold at least one of said packages in intimate engagement therewith, thereby providing a heat sink for said package;

(b) a heating element adapted to be maintained at a constant temperature while in use;

(c) a means for sequentially disposing one of said supports after the next in position to place a surface of the package engaged therewith in contact with said heating element, thereby enabling heat to be applied to said package to cure said cement while dissipating the excess heat in said support, thus preventing such excess heat from damaging said semiconductor element, said disposing means including a conveyor belt adapted to move said supports into and out of the desired position for application of heat.

4. Apparatus for sequentially sealing a series of packages, each having at least two parts with a heat-curable cement therebetween, and each containing a semiconductor element, which apparatus comprises:

(a) a support adapted to hold at least one of said packages in intimate engagement therewith, thereby providing a heat sink for said package, said support including a means for holding said packages in intimate engagement therewith;

(b) a heating element adapted to be maintained at a constant temperature while in use; and (c) a means for sequentially disposing one of said supports after the next in position to place a surface of the package engaged therewith in contact with said heating element, thereby enabling heat to be applied to said package to cure said cement while dissipating the excess heat in said support, thus preventing such excess heat from damaging said semiconductor element, said disposing means including a conveyor belt adapted to move said supports into and out of the desired position for application of heat.

5. Apparatus for sequentially sealing a series of packages, each having at least two parts with a heat-curable cement therebetween, and each containing a semiconductor element, which apparatus comprises:

(a) a support adapted to hold at least one of said packages in intimate engagement therewith, thereby providing a heat sink for said package, said support including a magnetic means for holding said packages in intimate engagement therewith;

(b) a heating element fabricated from a ceramic material adapted to be maintained at a constant temperature between about 360° C. and 1000° C. while in use;

(c) a means for sequentially disposing one of said supports after the next in position to place a surface of the packaged engaged therewith in contact with said heating element, thereby enabling heat to be applied to said package to cure said cement while dissipating the excess heat in said support, thus preventing such excess heat from damaging said semiconductor element, said disposing means including a conveyor belt adapted to move said supports into and out of the desired position for application of heat; and (d) means for rapidly cooling said packages after the application of heat thereto.

6. Apparatus for sequentially sealing a series of packages, each having at least two parts with a heat-curable cement therebetween, and each containing a semiconductor element, which apparatus comprises:

(a) a support adapted to hold a plurality of said packages in intimate engagement therewith, thereby providing a heat sink for said packages, said support including a magnetic means for holding said packages in intimate engagement therewith;

(b) a heating element fabricated from beryllium oxide adapted to be maintained at a constant temperature between about 360° C. and 1000° C. while in use;

(c) a means for sequentially disposing one of said supports after the next in position to place a surface of the packages engaged therewith in contact with said heating element, thereby enabling heat to be simultaneously applied to said packages to cure said cement while dissipating the excess heat in said support, thus preventing such excess heat from damaging said semiconductor elements, said disposing means including a conveyor belt adapted to move said supports into and out of the desired position for application of heat; and (d) means for rapidly cooling said packages after the application of heat thereto.

References Cited

UNITED STATES PATENTS

| | | | |
|---|---|---|---|
| 3,022,814 | 2/1962 | Bodine | 156—498 |
| 3,178,905 | 4/1965 | Boynton | 165—80 |
| 3,207,212 | 9/1965 | Carlson et al. | 165—80 |
| 3,221,394 | 12/1965 | Pitts | 269—8 |

EARL M. BERGERT, *Primary Examiner.*

D. SCHWARTZ, *Assistant Examiner.*